United States Patent [19]

McClure

[11] Patent Number: 5,577,051
[45] Date of Patent: Nov. 19, 1996

[54] STATIC MEMORY LONG WRITE TEST

[75] Inventor: David C. McClure, Carrollton, Tex.

[73] Assignee: SGS-Thomson Microelectronics, Inc., Carrollton, Tex.

[21] Appl. No.: 173,197

[22] Filed: Dec. 22, 1993

[51] Int. Cl.$^6$ .................................................. G11C 29/00
[52] U.S. Cl. ................................. 371/21.4; 365/201
[58] Field of Search ............................. 371/21.4, 21.1, 371/15.1, 21.3; 365/201, 154, 49; 324/210

[56]       References Cited

U.S. PATENT DOCUMENTS

| 4,460,978 | 7/1984 | Jiang et al. | 365/154 |
| 5,051,948 | 9/1991 | Watabe et al. | 365/49 |
| 5,255,230 | 10/1993 | Chan et al. | 365/201 |
| 5,289,475 | 2/1994 | Slemmer | 371/21.1 |
| 5,329,175 | 7/1994 | Peterson | 307/443 |
| 5,347,483 | 9/1994 | Torimaru | 365/49 |

Primary Examiner—Robert W. Beausoliel, Jr.
Assistant Examiner—Phung My Chung
Attorney, Agent, or Firm—Theodore E. Galanthay; Lisa K. Jorgenson; Renee M. Larson

[57]       ABSTRACT

According to the present invention, after a test data pattern has been written to selected static memory cells, the wordlines of the memory cells are turned off and the bitline true and bitline complement of the memory cells are simultaneously pulled to a predetermined logic level for the duration of the long write test so that the memory cells are disturbed. After the long write test, the contents of the memory cells are read to determine which memory cells contain corrupted data and therefore have bitline to memory cell leakage problems.

34 Claims, 2 Drawing Sheets

STATIC MEMORY LONG WRITE TEST

CROSS REFERENCE TO RELATED APPLICATIONS

The subject matter of the present application is related to copending United States application Ser. No. 08/172,854, titled "Stress Test Mode", Attorney Docket No. 93-C-56, filed with the Application hereof on Dec. 22, 1993, both assigned to the assignee hereof, and which is herein incorporated by reference.

BACKGROUND OF THE INVENTION

1. Field of the Invention

The present invention relates generally to static memory testing, and more specifically to an improved method and structure for performing long write tests on static memories.

2. Description of the Prior Art

Writing to a memory cell or cells of static memories, such as static random access memories (SRAMs), multiple port memories, and First In First Out (FIFO) memories, can sometimes affect adjacent memory cells on the same column that share a bitline. These memory cells should not be affected if their wordlines are off; however, leakage from a memory cell node to a bitline may be enough to overcome the pull-up resistance of the memory cell, causing the data of the memory cell to be corrupted. This problem is exacerbated by a long write cycle, because there is greater opportunity for such leakage to occur. Therefore, memory cell node to bitline leakage and subsequent corruption of memory cells is often a concern during long write testing of a static memory.

Long write testing is conducted after writing a test data pattern to selected memory cells of a static memory. The long write test problem occurs when writing to memory cells along a column and inadvertently affecting non-selected memory cells, whose wordlines are off. The non-selected memory cells that are affected have leakage problems from a memory cell node to a bitline that cause them to erroneously change state. The write cycle during a long write test is typically quite long, thereby providing time for the leakage problem to occur. To screen for leakage problems, test modes have been proposed which, after the wordlines of all memory cells are turned off, pull down bitline true or bitline complement of the entire memory array or a subset of the memory array in order to "disturb" the memory cells. The memory cells are then read following the disturb condition to check for errors in the states of individual memory cells.

However, two issues must be considered before adopting such a test mode. First, the data state of a memory cell and adjacent memory cells, on all sides of the memory cell, can be critical in determining whether the memory cell has a propensity to be disturbed during long write testing. For instance, memory cells tend to fail on either the bitline true or the bitline complement side of the cell, because only one side of a memory cell usually leaks. Thus, a memory cell may be more likely to fail if it has a 0 or a 1 stored in it. Additionally, adjacent memory cells frequently share common connections to power supplies. Therefore, the state of data stored in a memory cell, the state of data stored in adjacent memory cells, and the fact that memory cells may share common connections to power supplies are all factors which can greatly affect the memory cell's sensitivity to long write testing.

Second, when pulling down multiple bitlines of a memory cell, it is necessary to first turn off the bitlines in order to decrease power consumption. Incorporating the necessary bitline control to turn off appropriate bitline loads and pull bitlines to ground during the disturb for the various test data patterns to which a static memory is typically subjected necessarily introduces complicated circuitry to perform the requisite independent bitline load control function. Such complicated circuitry takes up valuable space within the static memory. A possible solution to these competing interests is to pull low the bitline true for all memory cells being tested and to leave the bitline complement high for all memory cells being tested; or, some other simple pattern may be used. However, such schemes have limited practical use, because they do not address the great number of different test data patterns typically used to test static memories.

SUMMARY OF THE INVENTION

It would be advantageous in the art to employ a long write testing method which effectively and efficiently tests memory cells of a static memory for leakage problems using minimal control circuitry.

It would further be advantageous in the art to utilize a memory structure which provides for effective and efficient long write testing of static memory cells so that memory cells which have leakage problems may be identified using minimal control circuitry.

Therefore, according to the present invention, after a test data pattern has been written to selected static memory cells, the wordlines of the memory cells are turned off and the bitline true and bitline complement of the memory cells are simultaneously pulled to a predetermined logic level for the duration of the long write test so that the memory cells are disturbed. After the long write test, the contents of the memory cells are read to determine which memory cells contain corrupted data and therefore have bitline to memory cell leakage problems.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides an effective and efficient way of performing long write testing on static memories, such as SRAMs, multiple port memories, and First In First Out (FIFO) memories, using simplified memory cell bitline control. Long write testing is a special test mode which may be entered a variety of ways, such as subjecting a pin of the static memory to an overvoltage condition or utilizing a clocking sequence. After writing a test data pattern into selected memory cells, the wordlines of all memory cells to be tested are turned off, and bitlines true and bitlines complement are pulled to a logic low level for the duration of the long write test. This allows any test data pattern to be stored in memory cells and then disturbed, all in one pass. The test data pattern may be based on the worst case disturb scenario, which is dependent on a number of factors, including the layout of the memory array, the sharing of power supplies between memory cells, and the topology that results from the orientation of memory cells relative to adjacent memory cells, so that any leakage problem present is maximized and thus identifiable.

Figure 1:
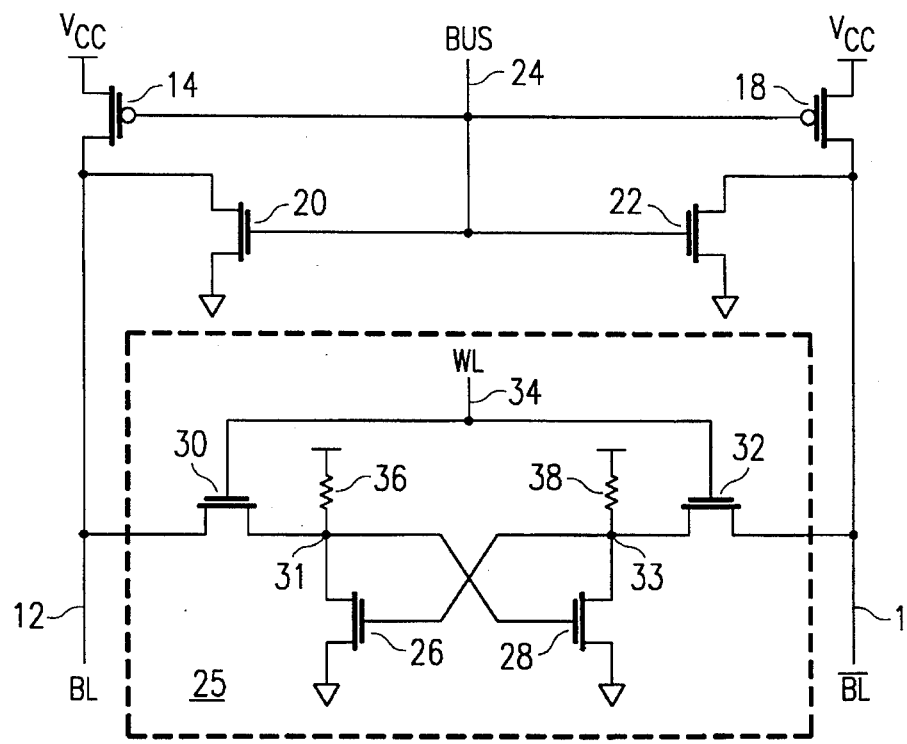
FIG. 1 is a memory structure, according to a first preferred embodiment of the present invention.

Referring to FIG. 1, a memory structure 10, according to a first preferred embodiment of the present invention, is shown. The bitline true 12 has a bitline true load 14, and bitline complement 16 has bitline complement load 18, connected as shown in FIG. 1. The bitline true load 14 and bitline complement load 18 are the gates of the p-channel transistors; one skilled in the art will recognize that the gates of n-channel transistors could serve as load devices as well. Additionally, memory structure 10 has pull-down transistor 20 connected to bitline true 12 and pull-down transistor 22 connected to bitline complement 16. Bus 24 is connected to the gates of bitline true load 14 and bitline complement load 18, as well as to the gates of pull-down transistor 20 and pull-down transistor 22. When bus 24 is pulled to a logic high level during the long write test, p-channel bitline true load 14 and p-channel bitline complement load 18 are turned off, n-channel pull-down transistors 20 and 22 turn on, and bitline true 12 and bitline complement 16 are simultaneously pulled to a logic low level, typically ground.

Thus, after data of a test data pattern is written to memory structure 10, the wordline 34 of memory structure 10 is turned off and during a long write test, bitline true 12 and bitline complement 16 are simultaneously pulled to a logic low level for the duration of the long write test by pulling bus 24 to a logic high level. Pulling bitline true 12 and bitline complement 16 simultaneously to a logic low level during the long write test causes memory structure 10 to be disturbed. After the long write test, memory structure 10 may be read to determine if memory cell 25 retained the data it held before the long write test. If the data is intact, memory structure 10 is not leaking from either bitline true 12 to memory cell node 31 through n-channel passgate 30 or from bitline complement 16 to memory cell node 33 through n-channel passgate 32 of memory cell 25. While leakage may occur through passgates 30 or 32, it is also possible for leakage to be caused by other defects, such as transistor isolation or defects between bitlines and internal cell nodes. However, if memory structure 10 does not contain the expected data, the data was most likely corrupted by a leakage problem that occurred during the long write test.

Memory cell 25 of memory structure 10 is of the Poly R Load type well known in the art and resides between bitline true 12 and bitline complement 16. The Poly R Load memory cell 25 has n-channel transistor 30 whose source/drain is connected to bitline true 12, and n-channel transistor 32 whose source/drain is connected to bitline complement 16. The gates of n-channel transistors 30 and 32 are connected to and controlled by wordline signal 34. The source/drain connections of n-channel transistors 26 and 28 are connected to n-channel transistors 30 and 32, respectively, as shown and are pulled up to the memory cell supply voltage $V_{CC}$ through polycrystalline silicon resistors 36 and 38, respectively. Memory cell node 31 is defined as the electrical connection of n-channel transistors 26, 28, 30, and polycrystalline silicon resistor 36. Memory cell node 33 is defined as the electrical connection of n-channel transistors 26, 28, 32, and polycrystalline silicon resistor 38. While a Poly-R Load memory cell is shown, other types of memory cells, such as a 6 Transistor memory cell may also be used in conjunction with the present invention.

Memory structure 10 is a standard structure with the exception of pull-down transistors 20 and 22 and the bitline load control afforded by bus 24, which ensure desired operation during a long write test. A SRAM which uses the present invention will contain a plurality of memory cells analogous in operation to memory cell 25. A FIFO memory cell or other multiple port memory will have at least one wordline. This means that the memory cells of an entire static memory array may incorporate the present invention or perhaps just a portion of the memory array will utilize the present invention.

Figure 2:
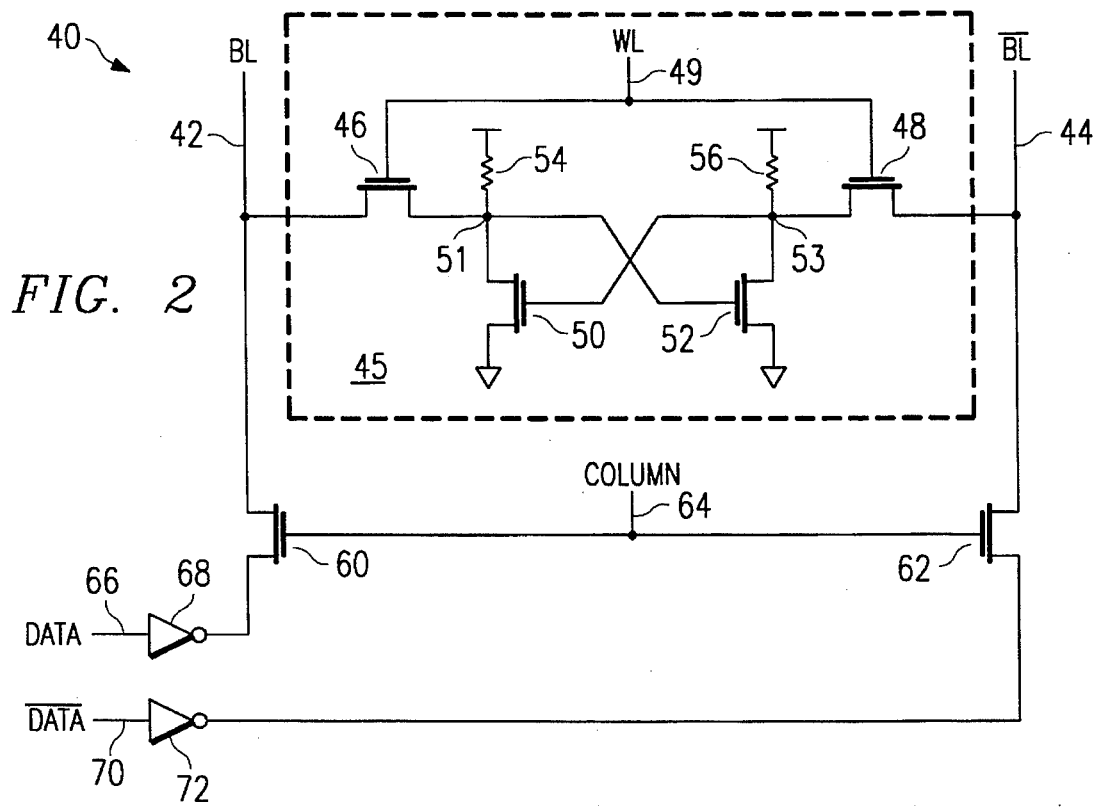
FIG. 2 is memory structure, according to a second preferred embodiment of the present invention.

Referring to FIG. 2, a memory structure 40, according to a second preferred embodiment of the present invention, is shown. Memory structure 40, similar to FIG. 1, also has a Poly-R Load memory cell 45 which resides between bitline true 42 and bitline complement 44. Poly R Load memory cell 45 has n-channel transistor 46 whose source/drain is connected to bitline true 42, and n-channel transistor 48 whose source/drain is connected to bitline complement 44. The gates of n-channel transistors 46 and 48 are connected to and controlled by the wordline signal 49. The source/drain connections of n-channel transistors 50 and 52 are connected to n-channel transistors 46 and 48, respectively, as shown and are pulled up to the memory cell supply voltage $V_{CC}$ through polycrystalline silicon resistors 54 and 56, respectively. Memory cell node 51 is defined as the electrical connection of n-channel transistors 46, 50, 52, and polycrystalline silicon resistor 54. Memory cell node 53 is defined as the electrical connection of n-channel transistors 48, 50, 52, and polycrystalline silicon resistor 56. While a Poly-R Load memory cell is shown, other types of memory cells, such as a 6 Transistor memory cell may also be used in conjunction with this embodiment of the present invention.

In conjunction with Poly-R Load memory cell 45, the second embodiment of the present invention features a bitline true passgate 60 and bitline complement passgate 62 whose gates are connected to and controlled by column decode signal 64. The source/drain of passgate 60 is connected to write driver 68 which has Data signal 66 as its input signal, and the source/drain of passgate 62 is connected to write driver 72 which has Data Complement signal 70 as its input signal.

The column of memory structure 40 is turned on by setting column decode signal 64 to a logic high level. Consequently, Data signal 66 and Data Complement signal 70 both go to a logic high level to write by using the column decode path and write drivers 68 and 72, respectively. Setting both Data signal 66 and Data Complement signal 70 to a logic high requires overriding the data-in buffer of memory structure 40, which is not shown here. In this way, bitline true 42 and bitline complement 44 are pulled to a logic low level for the duration of the long write testing by turning on the column of the memory structure and using write drivers 68 and 72. The present invention may easily be used to turn on multiple columns of a memory structure. For instance, the columns of a memory block or an entire memory array may be turned on according to this embodiment of the present invention. Thus, long write testing according to FIG. 2 allows column addresses to be overridden to effect multiple columns.

Thus, after data of a test data pattern is written to memory structure 40, the wordline 49 of memory structure 40 is turned off and during a long write test, bitline true 42 and bitline complement 44 are simultaneously pulled to a logic low level for the duration of the long write test by setting the column decode signal 64 to a logic high level such that write drivers 68 and 72 write to the memory structure. Consequently, Data signal 66 and Data Complement signal 70 both go to a logic high level to write by using the column decode path and write drivers 68 and 72, respectively. Setting both Data signal 66 and Data Complement signal 70 to a logic high requires overriding the data-in buffer of memory structure 40, which is not shown here. Pulling bitline true 42 and bitline complement 44 simultaneously to a logic low level during the long write test causes memory structure 40 to be disturbed. After the long write test, memory structure 40 may be read to determine if memory cell 45 retained the data it held before the long write test. If the data is intact, memory structure 40 is not leaking from either bitline 42 to memory cell node 51 through passgate n-channel transistor 46 or from bitline 44 to memory cell node 53 through passgate n-channel transistor 48 of memory cell 45. While leakage may occur through passgates 46 or 48, it is also possible for leakage to be caused by other defects, such as transistor isolation or defects between bitlines and internal cell nodes. However, if memory structure 40 does not contain the expected data, the data was most likely corrupted by a leakage problem that occurred during the long write test.

The embodiments shown in FIGS. 1 and 2 offers several advantages. Memory structures 10 and 40 allows the bitline true and bitline complement of a memory cell to be pulled to a logic low level, after the wordline has been turned off, for the duration of the long write testing so that the memory cell may be disturbed and then read after testing to determine if it has leakage from the bitlines to the memory cell node. The memory structure 40 of FIG. 2 accomplishes these goals without using the pull-down n-channel transistors shown in FIG. 1. Additionally, the memory structure 40 of FIG. 2 offers the advantage of producing small current transient conditions. Switching currents are limited by write drivers 68 and 72 which can service multiple columns.

Figure 3:
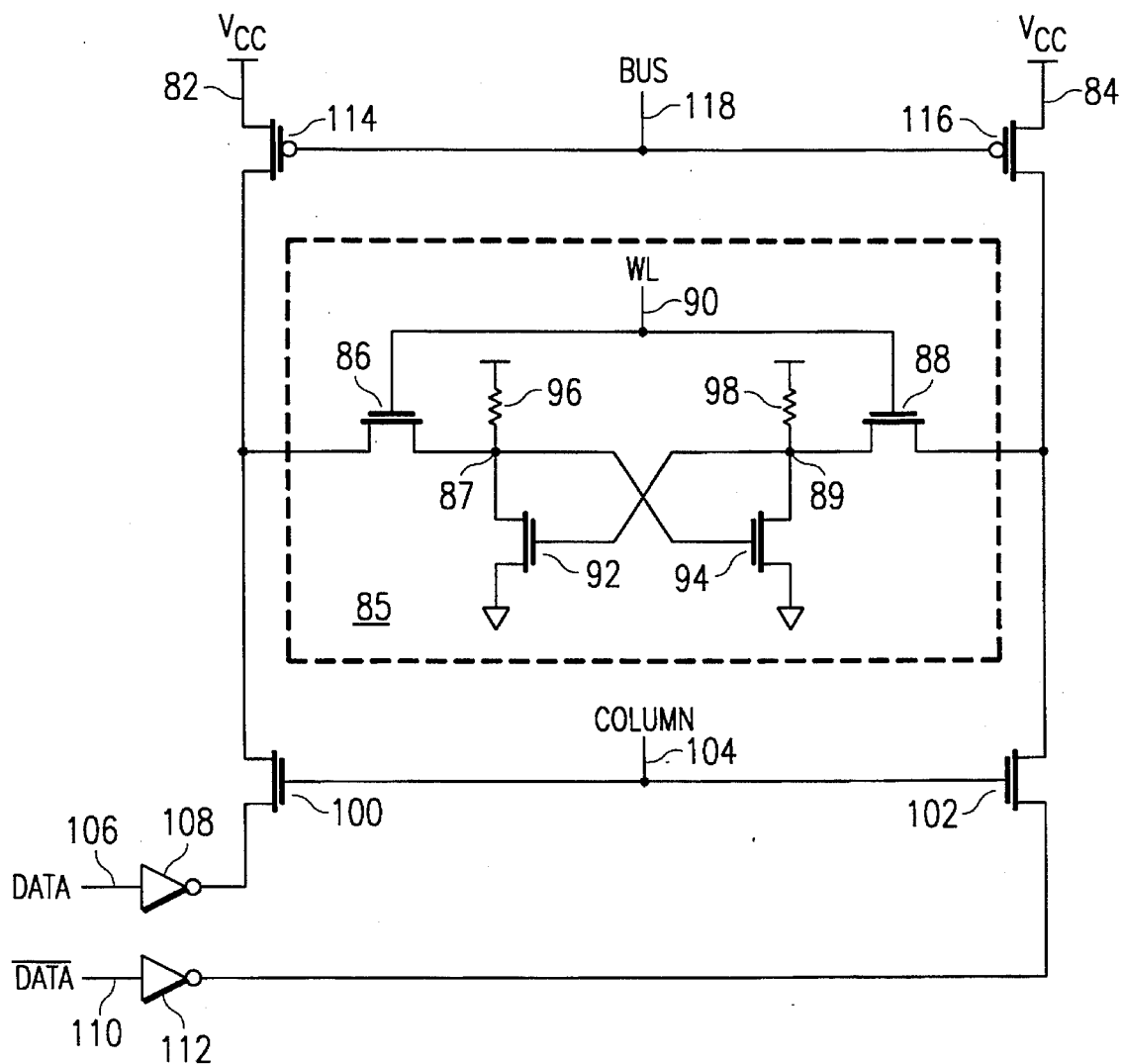
FIG. 3 is a memory structure showing an alternate embodiment to FIG. 2, according to the present invention.

The memory structure 80 of FIG. 3 may be used in place of the memory structure of FIG. 2 if it is necessary to turn off the bitlines loads of the memory structure. Analogous to FIG. 2, Poly R Load memory cell 85 has n-channel transistor 86 whose source/drain is connected to bitline true 82, and n-channel transistor 88 whose source/drain is connected to bitline complement 84. The gates of n-channel transistors 86 and 88 are connected to and controlled by the wordline signal 90. The source/drain connections of n-channel transistors 92 and 94 are connected to n-channel transistors 86 and 88, respectively, as shown and are pulled up to the memory cell supply voltage $V_{CC}$ through polycrystalline silicon resistors 96 and 98, respectively. Memory cell node 87 is defined as the electrical connection of n-channel transistors 86, 92, 94, and polycrystalline silicon resistor 96. Memory cell node 89 is defined as the electrical connection of n-channel transistors 88, 92, 94, and polycrystalline silicon resistor 98.

As in FIG. 2, the source/drain of passgate 100 is connected to write driver 108 which has Data signal 106 as its input signal, and the source/drain of passgate 102 is connected to write driver 112 which has Data Complement signal 110 as its input signal. The column of memory structure 40 is turned on by setting column decode signal 104 to a logic high level. Consequently, Data signal 106 and Data Complement signal 110 both go to a logic high level to write by using the column decode path and write drivers 108 and 112, respectively. Setting both Data signal 106 and Data Complement signal 110 to a logic high requires overriding the data-in buffer of memory structure 80, not shown here. In this way, bitline true 82 and bitline complement 84 are pulled to a logic low level for the duration of the long write testing by turning on the column of the memory structure and using write drivers 108 and 112. The present invention may easily be used to turn on multiple columns of a memory structure. For instance, the columns of a memory block or the entire memory array of an SRAM may all be turned on. Thus, long write testing according to FIG. 3 allows column addresses to be overridden to effect multiple columns. The addition of bus 118, which controls the gates of p-channel bitline true load 114 and p-channel bitline complement load 116, respectively, allows the bitline true 82 and bitline complement 84 of memory structure 80 to be pulled to a logic low level with no DC current by turning off bitline loads 114 and 116.

The present invention will not necessarily identify a memory cell which has leaking on both the bitline true and bitline complement sides of the memory cell. Nevertheless, such leakage failures are uncommon and the present invention is useful for identifying more commonly encountered leakage problems.

The present invention provides an improved memory structure and a method for performing an efficient and effective long write test on the memory cells of a static memory in order to identify memory cell leakage problems. Using the present invention, all memory cells to be tested may be simultaneously disturbed and then read to determine which, if any, memory cells have leakage problems. Additionally, a minimum amount of control circuitry is needed to accomplish a long write test according to the present invention. Thus, the present invention provides a big advantage over the prior art in terms of simplified control circuitry and effectiveness of the long write test. This advantage means increased flexibility, effectiveness, and efficiency, as well as reduced layout area and simplified control logic for controlling the wide variety of test data patterns typical of performing long write testing of static memories.

While the invention has been particularly shown and described with reference to a preferred embodiment, it will be understood by those skilled in the art that various changes in form and detail may be made therein without departing from the spirit and scope of the invention.

What is claimed is:

1. A method for performing a long write test on a static memory, comprising the steps of:

writing a test data pattern to a plurality of memory cells, having a data contents, of a static memory, wherein each memory cell, having at least one wordline, is connected to a bitline true and a bitline complement;

turning off the wordline of each .memory cell of the plurality of memory cells during the long write test;

pulling both the bitline true and bitline complement connected to each memory cell of the plurality of memory cells down to a low logic level during the long write test;

exiting the long write test; and reading the data contents of the plurality of memory cells to determine which of the plurality of memory cells contain corrupted data.

2. The method of claim 1, wherein the static memory is a static random access memory (SRAM).

3. The method of claim 1, wherein the static memory is a First In First Out (FIFO) memory.

4. The method of claim 1, wherein the bitline true is connected to a bitline true load and the bitline complement is connected to a bitline complement load, and the bitline true load and the bitline complement load are turned off when the bitline true and the bitline complement are pulled down to a low logic level during the long write test.

5. The method of claim 4, wherein the bitline true load and the bitline complement load are turned off for the duration of the long write test by forcing a bus connected to the bitline true load, the bitline complement load, a first pull-down transistor gate, and a second pull-down transistor gate to a predetermined logic level, and wherein the first pull-down transistor gate is connected to the bitline true load and the second pull-down transistor gate is connected to the bitline complement load.

6. The method of claim 5, wherein the bitline true load is a first transistor gate and the bitline complement load is a second transistor gate.

7. The method of claim 6, wherein the bitline true load is a first p-channel transistor gate, the bitline complement load is a second p-channel transistor gate, the first pull-down transistor gate is a first n-channel pull-down transistor, and the second pull-down transistor gate is a second n-channel pull-down transistor, such that when the bus is forced to the predetermined logic level, the first p-channel transistor gate and the second p-channel transistor gate are turned off, the first n-channel pull-down transistor and the second n-channel pull-down transistor are turned on, and the bitline true and bitline complement are pulled to a logic low level.

8. The method of claim 5, wherein the predetermined logic level is a high logic level.

9. The method of claim 1, wherein each of the memory cells is a Poly-R Load memory cell.

10. The method of claim 1, wherein each of the memory cells is a 6 Transistor memory cell.

11. The method of claim 1, wherein the low logic level is equal to ground potential.

12. The method of claim 1, wherein the bitline true is connected to a first passgate, the bitline complement is connected to a second passgate, a column decode signal is connected to both the first passgate and the second passgate, a first write driver having a first data input signal is connected to the first passgate, and a second write driver having a second data input signal is connected to the second passgate, and wherein the bitline true and the bitline complement are pulled to a low logic level by setting the column decode signal to a predetermined logic level, thus turning on a column of the static memory such that the first write driver and the second write driver force the bitline true and the bitline complement to the low logic level.

13. The method of claim 12, wherein the first passgate is a first n-channel transistor and the second passgate is a second n-channel transistor, the column decode signal is connected to the gate of the first n-channel transistor and the gate of the second n-channel transistor, and a source/drain of the first passgate is connected to the first write driver and a source/drain of the second passgate is connected to the second write driver.

14. The method of claim 12, wherein a plurality of columns, having column addresses, of the static memory are turned on by setting the column decode signal to the predetermined logic level, thus overriding the column addresses.

15. The method of claim 12, further comprising a bitline true load connected to the bitline true, a bitline complement load connected to the bitline complement, and a bus connected to the bitline true load and the bitline complement load, wherein the bitline true load and the bitline complement load are turned off for the duration of the long write test by forcing the bus to the predetermined logic level.

16. The method of claim 15, wherein the bitline true load and the bitline complement load are a first p-channel transistor gate and a second p-channel transistor gate, respectively.

17. The method of claim 12, wherein the predetermined logic level is equal to a logic high level.

18. A memory structure which provides improved long write testing of a static memory, comprising:

at least one wordline of a memory cell;

a bitline true of the memory cell which is connected to a true bitline load element and a first pull-down transistor;

a bitline complement of the memory cell which is connected to a complement bitline load element and a second pull-down transistor;

a bus connected to the bitline true load element, the first pull-down transistor, the bitline complement load element, and the second pull-down transistor, wherein after data of a test data pattern has been written to the memory cell, the wordline is turned off during a long write test, and the bitline true and bitline complement are pulled down to a low logic level by forcing the bus to a predetermined logic level such that the bitline true load and the bitline complement load are turned off during the long write test.

19. The memory structure of claim 18, wherein the bitline load is a first transistor gate and the bitline complement load is a second transistor gate.

20. The memory structure of claim 19, wherein the bitline true load is a first p-channel transistor gate, the bitline complement load is a second p-channel transistor gate, the first pull-down transistor gate is a first n-channel pull-down transistor, and the second pull-down transistor gate is a second n-channel pull-down transistor, such that when the bus is forced to the predetermined logic level, the first p-channel transistor gate and the second p-channel transistor gate are turned off, the first n-channel pull-down transistor and the second n-channel pull-down transistor are turned on, and the bitline true and bitline complement are pulled to a logic low level.

21. The memory structure of claim 18, wherein the predetermined logic level is a high logic level.

22. The memory structure of claim 18, wherein the memory cell is a Poly-R Load memory cell.

23. The memory structure of claim 18, wherein the memory cell is a 6 Transistor memory cell.

24. The memory structure of claim 18, wherein the low logic level is equal to ground potential.

25. The memory structure of claim 18, wherein the static memory is a static random access memory (SRAM).

26. The memory structure of claim 18, wherein the static memory is a First In First Out (FIFO) memory.

27. A memory structure which provides improved long write testing of a static memory, comprising:

a bitline true connected to a first transistor of a memory cell;

a bitline complement connected to a second transistor of the memory cell;

a first passgate connected to the bitline true;

a second passgate connected to the bitline complement;

a column decode signal connected to the first passgate and the second passgate;

a first write driver, having a first data input signal, which is connected to the first passgate;

a second write driver, having a second data input signal, which is connected to the second passgate; and a wordline connected to the first transistor and the second transistor of the memory cell, wherein after data of a test data pattern has been written to the memory cell, the wordline is turned off during a long write test, and the bitline true and the bitline complement are pulled to a logic low level by setting the column decode signal to a predetermined logic level, thus turning on a column of the static memory such that the first write driver and the second write driver force the bitline true and the bitline complement to the logic low level.

28. The memory structure of claim 27, wherein the first passgate is a first n-channel transistor and the second passgate is a second n-channel transistor, the column decode signal is connected to a gate of the first n-channel transistor and a gate of the second n-channel transistor, and a source/drain of the first passgate is connected to the first write driver and a source/drain of the second passgate is connected to the second write driver.

29. The memory structure of claim 27, wherein a plurality of columns, having column addresses, of the static memory are turned on by setting the column decode signal to the predetermined logic level, thus overriding the column addresses.

30. The memory structure of claim 27, further comprising a bitline true load connected to the bitline true, a bitline complement load connected to the bitline complement, and a bus connected to the bitline true load and the bitline complement load, wherein the bitline true load and the bitline complement load are turned off for the duration of the long write test by forcing the bus to the predetermined logic level.

31. The memory structure of claim 30, wherein the bitline true load and the bitline complement load are a first p-channel transistor gate and a second p-channel transistor gate, respectively.

32. The memory structure of claim 27, wherein the predetermined logic level is equal to a logic high level.

33. The memory structure of claim 27, wherein the static memory is a static random access memory (SRAM).

34. The memory structure of claim 27, wherein the static memory is a First In First Out (FIFO) memory.

* * * * *